(12) United States Patent
Kloster et al.

(10) Patent No.: US 6,846,755 B2
(45) Date of Patent: Jan. 25, 2005

(54) BONDING A METAL COMPONENT TO A LOW-K DIELECTRIC MATERIAL

(75) Inventors: Grant M. Kloster, Lake Oswego, OR (US); Jihperng Leu, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/369,931

(22) Filed: Feb. 18, 2003

(65) Prior Publication Data

US 2004/0161532 A1 Aug. 19, 2004

(51) Int. Cl.[7] .................... H01L 21/31; H01L 21/469
(52) U.S. Cl. .................... 438/778; 438/782; 438/783
(58) Field of Search .................... 438/778, 782, 438/783, 784, 795; 427/240

(56) References Cited

U.S. PATENT DOCUMENTS

| | | | |
|---|---|---|---|
| 6,277,765 B1 | 8/2001 | Cheng et al. | 438/773 |
| 6,362,091 B1 | 3/2002 | Andideh et al. | 438/624 |
| 6,436,822 B1 | 8/2002 | Towle | 438/681 |
| 6,482,754 B1 | 11/2002 | Andideh et al. | 438/780 |
| 6,495,474 B1 * | 12/2002 | Rafferty et al. | 438/766 |
| 6,699,797 B1 * | 3/2004 | Morris et al. | 438/778 |

OTHER PUBLICATIONS

Laughlin et al., "Using Sol–Gel Chemistry to Synthesize a Material with Properties Suited for Chemical Sensing", Journal of Chemical Education, vol. 77, No. 1, pp. 77–79, Jan. 2000.

* cited by examiner

*Primary Examiner*—Alexander Ghyka
(74) *Attorney, Agent, or Firm*—Trop, Pruner & Hu, P.C.

(57) ABSTRACT

A dielectric material is strengthened by bonding a metal component to the dielectric matrix. The metal component may be a metal oxide or metal oxide precursor. The metal component may be deposited on the substrate with the dielectric material, or sol-gel chemistry may be used and the liquid solution spin-coated on a substrate.

16 Claims, 2 Drawing Sheets

BONDING A METAL COMPONENT TO A LOW-K DIELECTRIC MATERIAL

FIELD OF THE INVENTION

This invention relates generally to semiconductor devices having one or more dielectric insulating layers with a low dielectric constant, and methods for making such devices.

BACKGROUND

Semiconductor devices include metal layers that are insulated from each other by dielectric layers. As device features shrink, reducing the distance between the metal lines on each layer, capacitance increases. The parasitic capacitance may contribute to effects such as RC delay, power dissipation, and capacitively coupled signals, also known as cross-talk. To address this problem, insulating materials that have relatively low dielectric constants (referred to as low-k dielectrics) are being used in place of silicon dioxide (and other materials that have relatively high dielectric constants) to form the dielectric layer that separates the metal lines.

Organic polymers have been used as insulating materials because their dielectric constants tend to be less than that of silicon dioxide, the most commonly used insulator. However, organic polymers typically suffer from lower mechanical strength and lower hardness than silicon dioxide. One measure of the mechanical strength or hardness is Young's modulus, also referred to as the modulus of elasticity (E).

One example of a material that may be used to form a low-k dielectric layer is carbon doped oxide (CDO). A CDO layer may be deposited on a substrate using a plasma-enhanced chemical vapor deposition (PECVD) process, for example. Spin-on carbon-doped oxide materials used to form insulating layers typically have low dielectric constants, often less than 2.0, but the modulus of elasticity (E) of such materials may be in the range of 1 to 3 GigaPascals (GPa).

In general, the modulus is a function of the material density, where $E=(E_0)(\rho^m)$. In this equation, E represents the predicted modulus, $E_0$ represents the modulus of the dense matrix, $\rho$ represents the density which is proportional to porosity and the dielectric constant (k), and m represents an experimentally determined exponent.

Dielectric materials with low dielectric constants (below about 2.0) tend to be at least 50% porous and typically have low mechanical strength. For example, carbon doped oxide (CDO) that is 58% porous has a calculated modulus of 3.0 GPa. Silicon dioxide ($SiO_2$) that is approximately 71% porous has a calculated modulus of 5.5 GPa. Fluorine doped silicon dioxide (SiOF) that is approximately 63% porous has a calculated modulus of 5.3 GPa. Low-k dielectric materials tend to be relatively brittle, and/or tend to crack or flake when exposed to stress. Their low mechanical strength limits or prevents their use for very thin films, such as those thinner than about 1 micron.

Accordingly, there is a need for a semiconductor device having a low-k dielectric layer with greater mechanical strength. Mechanical strength of at least about 8 GPa is considered desirable for semiconductor manufacturing processes. There is a need for an improved process for making such a semiconductor device.

DETAILED DESCRIPTION

In accordance with the present invention, a mechanically strengthened dielectric material is provided by bonding a high strength metal hardening component to the dielectric material. The metal component significantly increases the strength of the dielectric material, preferably to at least about 8 GPa, without substantially increasing the dielectric constant (k) of the material.

Figure 1:
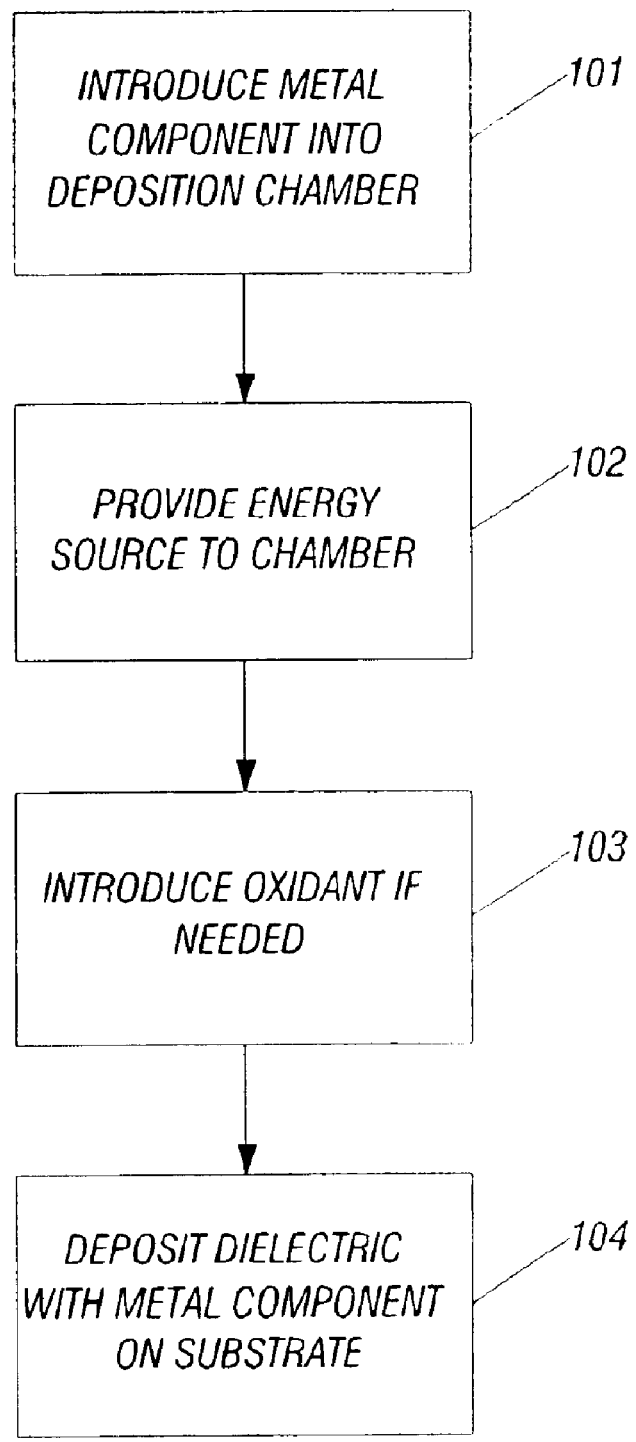
FIG. 1 is a block diagram of a method of including a metal bonding component in a dielectric according to one embodiment.

FIG. 1 shows one embodiment in which a strengthened dielectric material having a metal component is deposited on a substrate using chemical vapor deposition (CVD), plasma enhanced chemical vapor deposition (PECVD), high density plasma (HDP) co-deposition process or other deposition or co-deposition systems and methods.

In block 101, the metal component is introduced into a deposition chamber to bond with a dielectric material such as $SiO_2$, fluorine doped silicon dioxide, methyl silsesquioxane (MSQ), a low-k carbon-doped oxide (CDO), etc. In one embodiment, the metal component may be a metal oxide. Oxides of various metals may be used including but not limited to aluminum, magnesium, iron, ytterbium, or zirconium. One such metal oxide is $Al_2O_3$. Other examples of metal oxides that may be added to the dielectric matrix include BeO, MgO, FeO, $Yb_2O_3$ and $ZrO_2$.

In one embodiment, the metal component used in the deposition process comprises between about 1% and about 5% by atomic percent of the dielectric material. The metal component has significantly higher mechanical strength than the dielectric material, as indicated, for example, by a higher modulus of elasticity, preferably at least about 100 GPa, and a moderate k value, preferably below about 10.0. A small addition of a metal oxide, e.g., between about 1% and about 5% by atomic percent, increases the modulus of a dielectric such as carbon-doped oxide significantly, and preferably to at least 8 GPa, without a significant increase in the k value.

As shown in block 102, an energy source heats the deposition chamber. The energy source may be heat, induction RF, radiant, plasma, or ultraviolet, for example. In block 103, additional oxidant may be provided if needed.

In block 104, the strengthened dielectric material having a metal component bonded thereto is deposited on a substrate by chemical vapor deposition (CVD), plasma enhanced chemical vapor deposition (PECVD), high density plasma (HDP) co-deposition process or other deposition or co-deposition systems and methods.

The dielectric material, or interlayer dielectric (ILD), may provide an insulating layer between metal lines on a substrate. For example, the substrate may be silicon dioxide ($SiO_2$), fluorine doped silicon dioxide, methyl silsesquioxane (MSQ), a low-k carbon-doped oxide (CDO), etc. The substrate may be a semiconductor wafer from which multiple devices may be produced.

In one embodiment, a metal oxide component such as $Al_2O_3$ is introduced into a deposition chamber by using a tetraethyl orthosilicate (TEOS) precursor, and an aluminum precursor from trimethylaluminum (TMA), tri-isobutyl aluminum (TIBA), aluminum isoprpylate, dimethylaluminumn chloride (DMACl), demethylaluminum hydride (DMAH), trimethylamine alane (TMAAl), and an oxidant such as $H_2O_2$, $H_2O$, $N_2O$ or $O_2$. The ionic metal oxide component may be incorporated with an addition of precursor line(s) to an existing interlayer dielectric deposition tool or material such as PECVD, PTEOS, and CDO or PECVD/HDP SiOF.

Another example of a metal oxide component to strengthen a dielectric material is magnesium oxide (MgO) which has a modulus (E) of approximately 300 GPa and k value of approximately 9.7. Precursors for Mg-O include but are not limited to magnesium acetylacetonate or bis(2,2,6,6,-tetramethyl-3,5-heptanedionate)magnesium [Mg(TMHD)$_2$].

In one embodiment, two or more metal oxide components may be provided to the deposition chamber and both may be bonded to the dielectric matrix. For example, magnesium-oxygen and aluminum-oxygen may be used to form a $SiO_2$—$Al_2O_3$—MgO.

Figure 3:
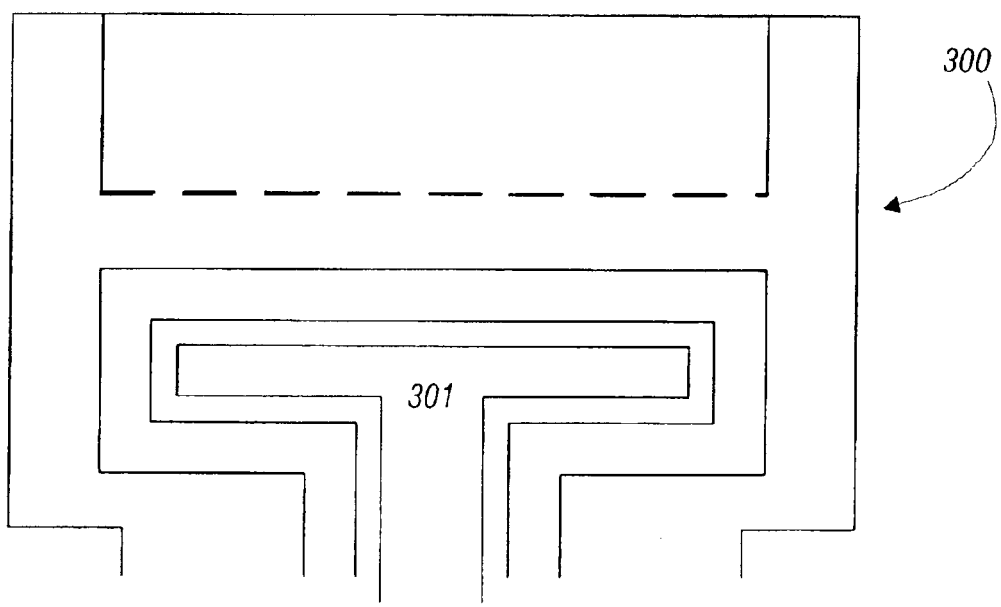
FIG. 3 provides a schematic representation of a CVD chamber for a PECVD reactor which may be used according to one embodiment.

In one embodiment of the present invention, a substrate, e.g., a silicon wafer upon which various conducting and insulating layers may have been formed, is placed in a chemical vapor deposition chamber or apparatus, preferably a PECVD reactor. In a particularly preferred embodiment, shown in FIG. 3, reactor 300 includes chuck 301 for holding the wafer. A PECVD reactor may be obtained from Applied Materials, Inc. or Trikon Technologies, Inc. To form a CDO layer on such a substrate, in accordance with a method of the present invention, a metal oxide precursor is introduced into the reactor in the conventional manner. In some cases, it may be desirable to feed an oxygen source into the reactor, in addition to the metal oxide precursor.

The substrate on which the dielectric may be deposited may be any surface, generated when making a semiconductor device, upon which an insulating layer may be formed. The substrate may include, for example, active and passive devices that are formed on a silicon wafer such as transistors, capacitors, resistors, diffused junctions, gate electrodes, local interconnects, etc. The substrate also may include insulating materials (e.g., silicon dioxide, either undoped or doped with phosphorus (PSG) or boron and phosphorus (BPSG); silicon nitride; silicon oxynitride; silicon carbide; carbon doped oxide; an organic containing silicon oxide; or a polymer) that separate such active and passive devices from conductive layers that are formed on top of them, and may include various types of conductive layers.

Thus, in accordance with one embodiment of the invention, a strengthened dielectric layer may be formed using deposition techniques, e.g., a conventional spin-on deposition process or plasma enhanced chemical vapor deposition (PECVD). When using a deposition process such as PECVD to form a carbon-doped oxide based insulating layer, gases that provide a source of silicon, oxygen, and carbon are fed into a PECVD reactor or chamber. The insulating layer preferably has a thickness of between about 300 and about 3,000 nanometers.

Figure 2:
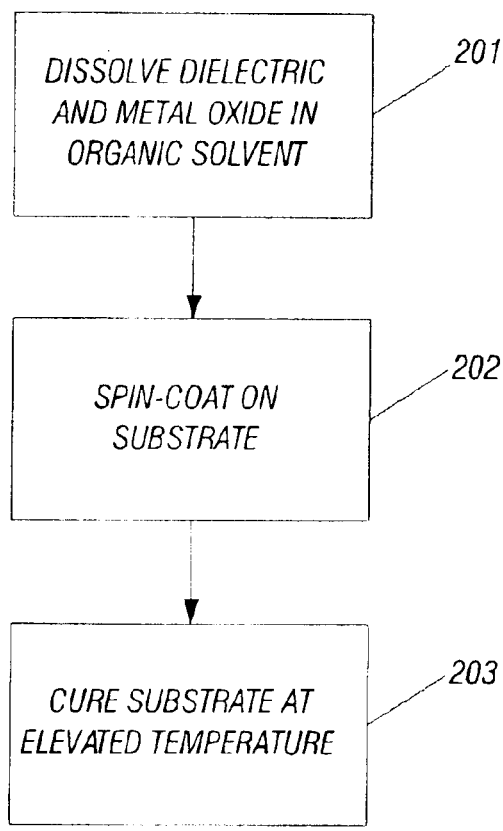
FIG. 2 is a block diagram of a method of including a metal component using sol-gel chemistry according to an embodiment.

In another embodiment of the invention, a sol-gel chemistry may be used to form a liquid mixture of a dielectric material and metal hardening component that may be spin-coated on the surface of the substrate to a desired thickness and then cured at an elevated temperature. FIG. 2 is a block diagram of an embodiment in which sol-gel chemistry is used to form the strengthened dielectric material. A metal oxide component may be selected to enhance the mechanical strength of the dielectric material with only a small increase in the dielectric constant (k).

Sol-gel chemistry refers to processes by which largely inorganic polymers may be synthesized. A sol is a dispersion of colloidial particles. A gel is an interconnected polymeric network formed by assembly of the sol. The gelation proceeds through stages by which the product's rigidity is increased. The final material produced is a porous glasslike solid, which also may be termed a xerogel.

In block 201, according to one embodiment, the dielectric material and metal oxide are immersed in and preferably dissolved in an organic solvent such as ethanol. In block 202, the liquid solution is spin-coated on a substrate surface. In block 203, the substrate with the spin-coated surface is cured at an elevated temperature, during which some of the liquid evaporates and the remaining dielectric/metal bonded matrix provides a hardened dielectric layer.

One example of a metal oxide that may be bonded with a dielectric using a sol-gel chemistry is MgO bonded with $SiO_2$. In one embodiment, between about 1% and about 2% by atomic percent of Mg(OEt)$_2$ is added to Si(OEt)$_4$, Si(OEt)$_3$(CH$_3$), and poly(ethylene oxide), and spin-coated and cured to provide an MgO-doped porous CDO film. The symbol Et represents ethylene, $C_2H_5$.

In one embodiment, in which a sol-gel chemistry is used, metal ions may insert themselves into the dielectric material and provide metal oxide bonds that help improve the mechanical strength of the dielectric material. An example of such use of metal ions is iron (II) citrate and Si(OEt)$_4$, Si(OEt$_3$(CH$_3$), and poly(ethylene oxide). In one embodiment using a sol-gel chemistry, metal ions such as Be$^{2+}$, Mg$^{2+}$ or Yb$^{2+}$ may be inserted into the oxide network.

In another embodiment using a sol-gel chemistry, two or more metal oxide components, such as Mg[Al(OPr)$_4$]$_2$ may be mixed with Si(OEt)$_3$(CH$_3$) and poly(styrene) to provide a magnesium-aluminum doped porous CDO dielectric material.

In one embodiment, one or more sol-gel precursors may be added to a dielectric material such as Si(OR)$_x$(CH$_3$)$_{4-x}$, where x=1 to 4 and R=alkyl. For example, sol-gel precursors may be metal acetates or metal alkoxides such as Be(OOCCH$_3$)$_2$, Mg(OOCH$_3$)$_2$, or Mg(OCH$_2$CH$_3$)$_2$.

The metal component significantly increases the mechanical strength of a dielectric material or dielectric film compared to the same or similar films having the same k value. As a result, low-k dielectrics may be integrated into microelectronic devices without significantly re-engineering back-end process steps to accommodate mechanically weak materials. In one embodiment, a sol-gel process further expands the variety of metal oxides that may be incorporated into the dielectric material, and thus provides great flexibility in optimizing dielectric film properties without sacrificing mechanical strength.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   adding a metal oxide component to a dielectric material in a deposition chamber, the dielectric material having a dielectric constant below about 2.0;
   providing an energy source to the dielectric material and metal oxide component in the deposition chamber; and
   depositing the dielectric material and metal oxide component on a substrate.

2. The method of claim 1 wherein the metal oxide component constitutes between about 1% and about 5% by atomic percent of the dielectric material.

3. The method of claim 1 further comprising introducing a precursor of the metal oxide component into the deposition chamber.

4. The method of claim 1 wherein the metal oxide component is an oxide of aluminum.

5. The method of claim 1 wherein the metal oxide component is an oxide of magnesium.

6. The method of claim 1 further comprising introducing an additional oxidant into the deposition chamber.

7. The method of claim 1 wherein the metal oxide component has a modulus of elasticity of at least about 100 gigapascals.

8. A method comprising: immersing a dielectric material and a metal acetate in an organic solvent; spin-coating the dielectric material and metal acetate on a substrate; and curing the substrate having a spin-coated surface.

9. The method of claim 8 including immersing beryllium acetate in the organic solvent.

10. The method of claim 8 including immersing magnesium acetate in the organic solvent.

11. The method of claim 8 including immersing the dielectric material and metal acetate in ethanol.

12. A method comprising:

combining a metal ion with a dielectric material, said metal ion to insert into the dielectric material and provide a metal oxide bond; and spin-coating the dielectric material and metal ion on a substrate.

13. The method of claim 12 including curing the substrate having the spin-coated surface.

14. The method of claim 12 including combining iron (II) citrate with a dielectric material.

15. The method of claim 12 including combining magnesium ions with a dielectric material.

16. The method of claim 12 including immersing the metal ion and dielectric material in an organic solvent.

* * * * *